United States Patent
Shigihara et al.

(10) Patent No.: US 9,704,805 B2
(45) Date of Patent: Jul. 11, 2017

(54) SEMICONDUCTOR DEVICE AND MANUFACTURING METHOD OF SAME

(71) Applicant: RENESAS ELECTRONICS CORPORATION, Tokyo (JP)

(72) Inventors: Hisao Shigihara, Kanagawa (JP); Hiromi Shigihara, Kanagawa (JP); Akira Yajima, Kanagawa (JP); Hiroshi Tsukamoto, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/139,825

(22) Filed: Apr. 27, 2016

(65) Prior Publication Data

US 2016/0240484 A1  Aug. 18, 2016

Related U.S. Application Data

(63) Continuation of application No. 13/924,938, filed on Jun. 24, 2013, now Pat. No. 9,343,395.

(30) Foreign Application Priority Data

Jul. 17, 2012 (JP) ................................ 2012-158667

(51) Int. Cl.
*H01L 23/00* (2006.01)
*H01L 23/532* (2006.01)
(Continued)

(52) U.S. Cl.
CPC .... *H01L 23/53238* (2013.01); *H01L 21/4885* (2013.01); *H01L 23/293* (2013.01);
(Continued)

(58) Field of Classification Search
CPC ................................................ H01L 23/53238
See application file for complete search history.

(56) References Cited

U.S. PATENT DOCUMENTS

| 8,227,341 B2 | 7/2012 | Onai et al. |
| 2003/0030142 A1 | 2/2003 | Nakatani |

(Continued)

FOREIGN PATENT DOCUMENTS

| JP | 5-55727 A | 3/1993 |
| JP | 3010974 A | 3/1995 |

(Continued)

OTHER PUBLICATIONS

Japanese Office Action received in corresponding Japanese Application No. 2012-158667 dated Jul. 19, 2016.
(Continued)

*Primary Examiner* — William Harriston
(74) *Attorney, Agent, or Firm* — Mattingly & Malur, PC

(57) ABSTRACT

To provide a semiconductor device having improved reliability by improving a coupling property between a semiconductor chip and a bonding wire. A redistribution layer is comprised of a Cu film, an Ni film, and a Pd film which have been formed successively from the side of a semiconductor substrate. The Pd film on the uppermost surface is used as an electrode pad and a bonding wire made of Cu is coupled to the upper surface of the Pd film. The thickness of the Pd film is made smaller than that of the Ni film and the thickness of the Ni film is made smaller than that of the Cu film. The Cu film, the Ni film, and the Pd film have the same pattern shape in a plan view.

10 Claims, 8 Drawing Sheets

(51) Int. Cl.
  H01L 23/498 (2006.01)
  H01L 21/48 (2006.01)
  H01L 23/525 (2006.01)
  H01L 23/29 (2006.01)
  H01L 23/495 (2006.01)
  H01L 23/31 (2006.01)

(52) U.S. Cl.
  CPC ...... H01L 23/49811 (2013.01); H01L 23/525 (2013.01); H01L 24/03 (2013.01); H01L 24/05 (2013.01); H01L 24/06 (2013.01); H01L 24/43 (2013.01); H01L 24/46 (2013.01); *H01L 23/3192* (2013.01); *H01L 23/4952* (2013.01); *H01L 24/13* (2013.01); *H01L 24/16* (2013.01); *H01L 24/45* (2013.01); *H01L 24/48* (2013.01); *H01L 24/85* (2013.01); *H01L 24/94* (2013.01); *H01L 2224/0239* (2013.01); *H01L 2224/02311* (2013.01); *H01L 2224/02313* (2013.01); *H01L 2224/02373* (2013.01); *H01L 2224/02377* (2013.01); *H01L 2224/02379* (2013.01); *H01L 2224/0345* (2013.01); *H01L 2224/0347* (2013.01); *H01L 2224/0361* (2013.01); *H01L 2224/03462* (2013.01); *H01L 2224/03474* (2013.01); *H01L 2224/03914* (2013.01); *H01L 2224/0401* (2013.01); *H01L 2224/04042* (2013.01); *H01L 2224/05008* (2013.01); *H01L 2224/05084* (2013.01); *H01L 2224/05147* (2013.01); *H01L 2224/05155* (2013.01); *H01L 2224/05171* (2013.01); *H01L 2224/05548* (2013.01); *H01L 2224/05569* (2013.01); *H01L 2224/05644* (2013.01); *H01L 2224/05664* (2013.01); *H01L 2224/06135* (2013.01); *H01L 2224/06138* (2013.01); *H01L 2224/131* (2013.01); *H01L 2224/13144* (2013.01); *H01L 2224/16245* (2013.01); *H01L 2224/45144* (2013.01); *H01L 2224/45147* (2013.01); *H01L 2224/48091* (2013.01); *H01L 2224/48247* (2013.01); *H01L 2224/48463* (2013.01); *H01L 2224/48465* (2013.01); *H01L 2224/48644* (2013.01); *H01L 2224/48664* (2013.01); *H01L 2224/48844* (2013.01); *H01L 2224/48864* (2013.01); *H01L 2224/85181* (2013.01); *H01L 2224/94* (2013.01); *H01L 2924/00* (2013.01); *H01L 2924/00014* (2013.01); *H01L 2924/1306* (2013.01); *H01L 2924/181* (2013.01)

(56) References Cited

U.S. PATENT DOCUMENTS

| | | | |
|---|---|---|---|
| 2004/0140539 A1* | 7/2004 | Abbott | H01L 23/49582 257/666 |
| 2005/0048798 A1* | 3/2005 | Bojkov | C23F 1/18 438/784 |
| 2007/0275503 A1 | 11/2007 | Lin et al. | |
| 2010/0164105 A1* | 7/2010 | Onai | H01L 23/53238 257/751 |

FOREIGN PATENT DOCUMENTS

| | | |
|---|---|---|
| JP | 7-130790 A | 5/1995 |
| JP | 10-50915 A | 2/1998 |
| JP | 2001-053075 A | 2/2001 |
| JP | 2001-244287 A | 9/2001 |
| JP | 2005-150578 A | 6/2005 |
| JP | 2010-171386 A | 8/2010 |

OTHER PUBLICATIONS

Japanese Office Action received in corresponding Japanese Application No. 2012-158667 dated Nov. 17, 2015.

* cited by examiner

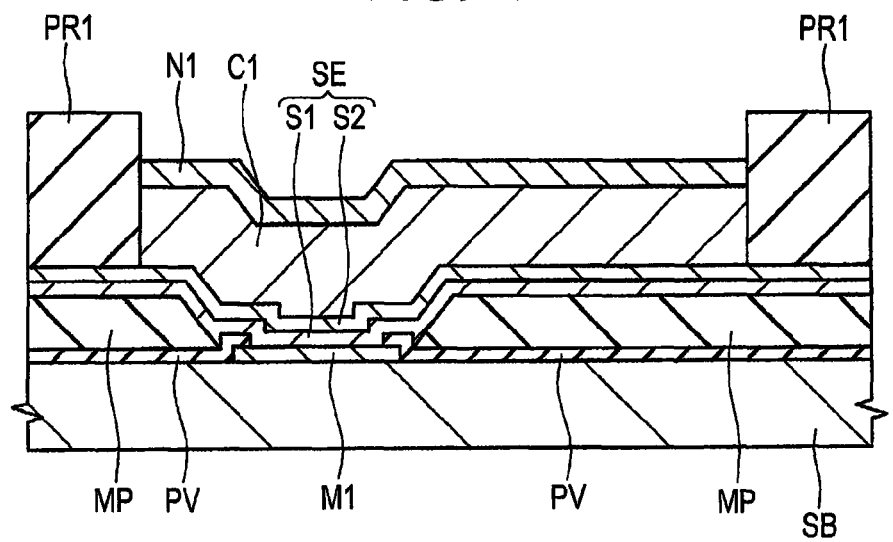
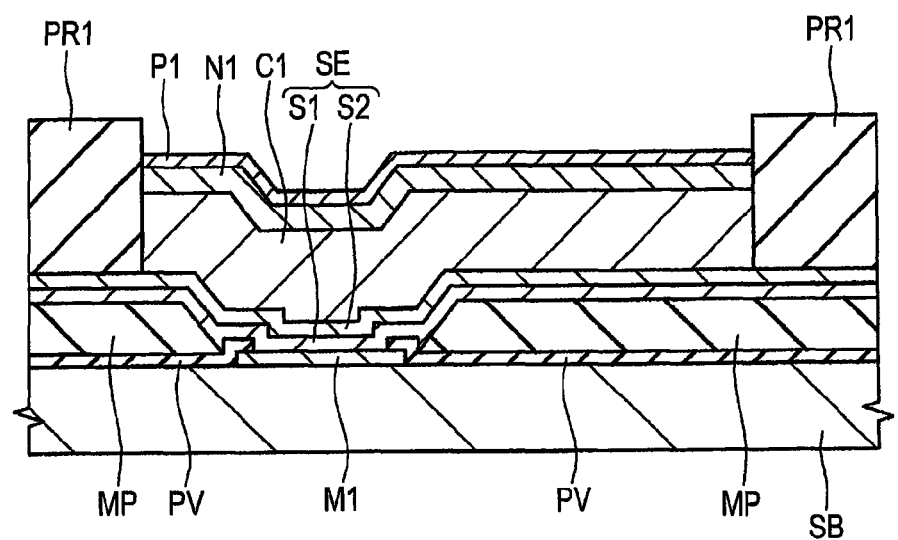

SEMICONDUCTOR DEVICE AND MANUFACTURING METHOD OF SAME

CROSS-REFERENCE TO RELATED APPLICATIONS

The application is a continuation application of U.S. Ser. No. 13/924,938, filed Jun. 24, 2013, the disclosure of Japanese Patent Application No. 2012-158667 filed on Jul. 17, 2012 including the specification, drawings and abstract is incorporated herein by reference in its entirety.

BACKGROUND

The present invention relates to a semiconductor device and a manufacturing method of the same, in particular, to a technology effective when applied to a semiconductor device in which a semiconductor chip is coupled to external coupling terminals through wire bonding or the like.

It is known that when after processing treatment (wafer processing step), a passivation film, a polyimide layer, and the like are formed on a substrate and then, a bonding wire made of Cu (copper) or Au (gold) is electrically coupled to a semiconductor chip, a redistribution layer electrically coupled to elements on the upper surface of the substrate is formed on the semiconductor chip and a bonding wire is coupled onto a pad on the redistribution layer. As the bonding pad for coupling the bonding wire thereto, for example, Au (gold) is used.

Patent Document 1 (Japanese Patent Laid-Open No. 2001-53075) describes that a Cu (copper) deposit layer is subjected to isotropic etching to secure a space for the formation of a covering layer and then, a Ni/Au deposit layer is formed in the space. According to this document, a Ni/Pd deposit layer may be formed instead of the Ni/Au deposit layer on the surface of a redistribution layer made of the Cu (copper) deposit layer. Since the above-mentioned etching makes the pattern width of the redistribution layer narrower than that of the Cu (copper) deposit layer, a deposit layer formed on the redistribution layer covers the upper surface and side surface of the redistribution layer. This document does not include a description on a Ni (nickel) film and a Pd (palladium) film configuring the Ni/Pd deposit layer and the relationship of their thickness. In addition, according to this document, a wire made of Au (gold) is bonded to a bonding pad on the redistribution layer.

Patent Document 2 (Japanese Patent Laid-Open No. 2005-150578) describes the use of a film stack of a Ti (titanium) film and a Pd (palladium) film stacked in the order of mention as a redistribution layer to be used as an underlying film of an Au bump.

Patent Document 3 (Japanese Patent Laid-Open No. 2001-244287) describes the formation of a Cu (copper) film having a thickness of from a few hundred nm to a few thousand nm, followed by formation thereon a cap metal made of, for example, Ni (nickel), Au (gold), Pt (platinum), or Pd (palladium), or an alloy thereof, as films configuring a redistribution layer.

PRIOR ART DOCUMENTS

Patent Documents

[Patent Document 1] Japanese Patent Laid-Open No. 2001-53075
[Patent Document 2] Japanese Patent Laid-Open No. 2005-150578
[Patent Document 3] Japanese Patent Laid-Open No. 2001-244287

SUMMARY

When Au (gold) is used as a material of a bonding pad for coupling thereto a bonding wire made of Cu (copper) or Au (gold), an Au (gold) film formed on the whole surface of a redistribution layer causes deterioration in the reliability of a semiconductor device because it has relatively low adhesion with a mold covering a semiconductor chip. In addition, formation of an Au film on the whole upper surface of the redistribution layer increases a manufacturing cost. When Au (gold) is used as a material of the bonding pad, it is therefore necessary to form a pattern of the bonding pad only in a region on the redistribution layer with a mask different from that for the formation of the redistribution layer and thereby minimize a wire bonding area.

In this case, however, the redistribution layer itself cannot be used as a wire bonding area and an area necessary for pad formation should be secured on the redistribution layer. This reduces the freedom degree of the layout of the redistribution layer and makes it difficult to decrease the area of the semiconductor device.

In addition to the above-mentioned problem, the area of the wire bonding area reduced to the minimum may deteriorate the coupling property between the bonding wire and the pad.

Other problems and novel features will be apparent from the description herein and accompanying drawings.

Typical embodiments disclosed herein will next be described simply.

In a semiconductor device according to one embodiment of the invention, the uppermost surface of a redistribution layer is covered with a Pd (palladium) film formed using plating and a bonding wire made of Cu (copper) is coupled directly to the upper surface of the Pd film.

According to the one embodiment of the invention disclosed herein, a semiconductor device having improved reliability can be provided.

BRIEF DESCRIPTION OF THE DRAWINGS

FIG. 7 is a cross-sectional view showing the method for manufacturing the semiconductor device following that of FIG. 6;

FIG. 8 is a cross-sectional view showing the method for manufacturing the semiconductor device following that of FIG. 7;

DETAILED DESCRIPTION

Figure 1:
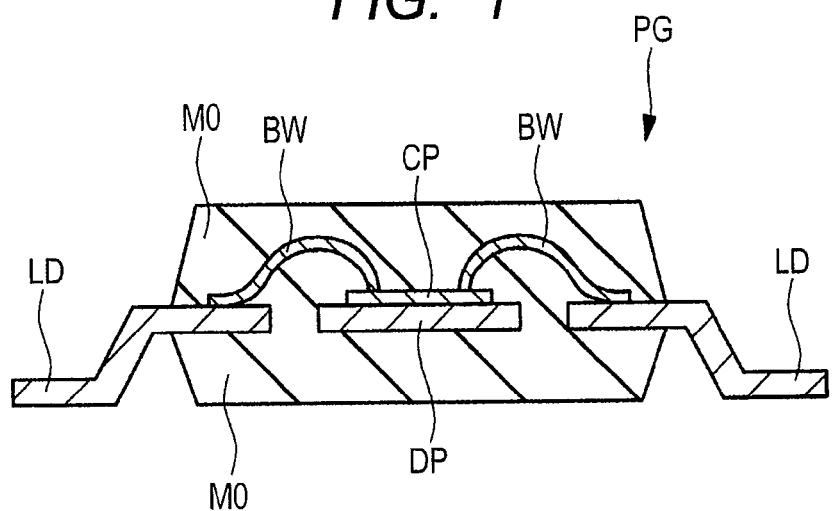
FIG. 1 is a cross-sectional view showing a semiconductor device according to one embodiment of the invention.

The invention will hereinafter be described specifically based on drawings. In all the drawings for describing the below-described embodiment, members of a like function will be identified by like reference numerals and overlapping descriptions will be omitted. In the below-described embodiments, a repeated description of the same or like parts will be omitted in principle unless particularly necessary.

In a semiconductor device according to the present embodiment, a Pd (palladium) film is formed on the uppermost surface of a redistribution layer formed on the upper surface of a semiconductor chip and a bonding wire made of Cu (copper) or Au (gold) is coupled to the upper surface.

Figure 2:
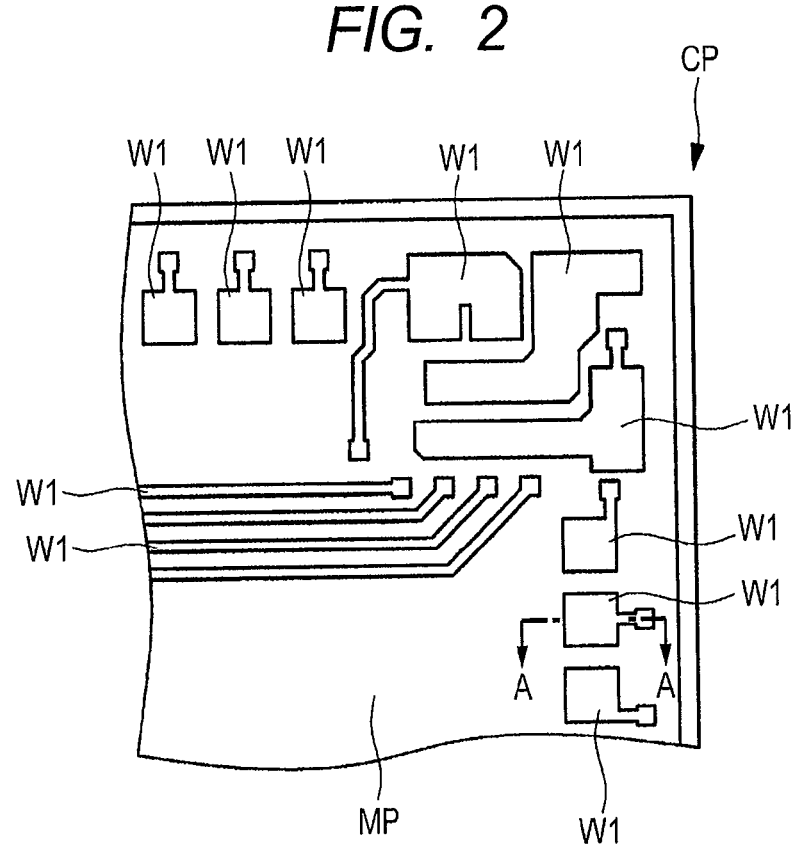
FIG. 2 is a wiring layout showing the semiconductor device according to the one embodiment of the invention.
Figure 3:
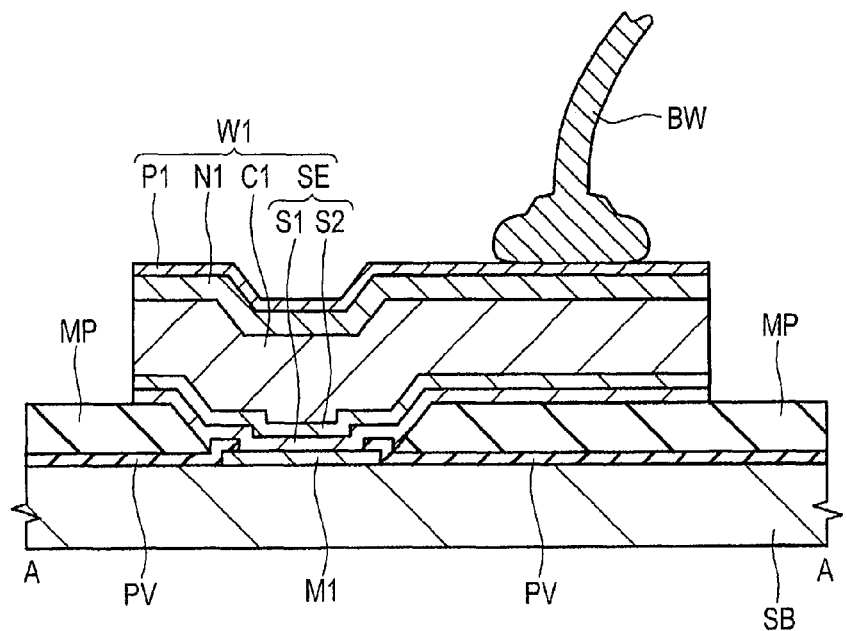
FIG. 3 is a cross-sectional view showing the semiconductor device according to the one embodiment of the invention.

First, the semiconductor device of the present embodiment is described referring to FIGS. 1 to 3. FIG. 1 is a cross-sectional view of an IC package obtained by sealing, with a molding resin, a semiconductor chip configuring the semiconductor device of the present embodiment and coupled to a lead via a bonding wire. The term "semiconductor chip" as used herein means each of individual dies obtained by cutting a semiconductor wafer (semiconductor substrate) having, on the surface thereof, an IC (integrated circuit) such as semiconductor element. In the present embodiment, a bonding wire BW is given as an example of an external coupling terminal, but not only it but also a bump electrode made of solder, Au (gold) or the like can be used.

As shown in FIG. 1, the semiconductor device according to the present embodiment has a semiconductor chip CP mounted on a die pad DP. The semiconductor chip CP is electrically coupled to a plurality of leads LD via a plurality of bonding wires BW and the semiconductor chip CP, the die pad DP, and the plurality of bonding wires BW are covered and sealed with a mold MO made of an insulator such as epoxy resin. A portion of the each of plurality of leads LD including an area to which the bonding wire BW has been coupled is sealed with the mold MO and the other portion is exposed outside from the mold MO.

The die pad DP and the lead LD are conductor plates obtained by cutting a leadframe formed by processing a piece of metal plate made of, for example, Cu (copper) through press punching or etching. The bonding wire BW is a conductor wire made of, for example, Cu (copper) and is formed so as to electrically couple the semiconductor chip CP to the outside of the IC package PG.

Next, FIG. 2 shows a portion of a planar layout of the semiconductor chip CP. In a plan view, the semiconductor chip CP is rectangular. The layout of redistribution layers in the vicinity of one of the corners of the semiconductor chip CP is shown in FIG. 2. As shown in FIG. 2, the semiconductor chip CP has, on the upper surface thereof, a plurality of redistribution layers W1. As will be described later referring to FIG. 3, the redistribution layer W1 is a film stack of a plurality of conductor films and has, as the uppermost layer, a film made of Pd (palladium). Each redistribution layer W1 has therearound a polyimide layer MP which is an insulating layer described later.

As shown in FIG. 2, some of the redistribution layers W1 each have a region having a relatively small wiring width and a region having a relatively large wiring width. The region of the redistribution layer W1 having a relatively large wiring width and therefore having a large area is a region to be used as a pad to which an end portion of the bonding wire BW (refer to FIG. 1) is to be bonded. The bonding wire BW is omitted from FIG. 2. The bonding wire BW can be coupled to any region of the upper surface of the redistribution layer W1 from which the Pd (palladium) film is exposed, because the whole upper surface of the redistribution layer W1 is covered with a Pd (palladium) film having a relatively good coupling property with a Cu (copper) wire or Au (gold) wire. The redistribution layer W1 in a region to which the bonding wire BW is bonded requires a certain area. The bonding wire BW is therefore coupled to the above-mentioned region with a relatively large wiring width.

Next, a cross-sectional view of the semiconductor chip configuring the semiconductor device of the present embodiment is shown in FIG. 3. FIG. 3 shows a cross-section taken along a line A-A of FIG. 2. A semiconductor substrate SB is not shown in detail in FIG. 3 but it includes, for example, a substrate made of a single crystal silicon, semiconductor elements such as MISFET (metal insulator semiconductor field effect transistor) formed on the upper surface of the substrate, and a wiring layer formed on the semiconductor element.

More specifically, the semiconductor substrate SB has, on the bottom portion thereof, the above-mentioned substrate made of single crystal silicon and a plurality of semiconductor elements formed on the upper surface of the sub-strate. The upper surface of the substrate and the plurality of semiconductor elements are covered with an interlayer insulating film and a contact plug penetrating through the interlayer insulating film is coupled to the substrate or the plurality of semiconductor elements. The interlayer insulating film has thereon a plurality of interlayer insulating films stacked one after another from the side of the substrate and each of the plurality of interlayer insulating films has therein a wiring buried by using the damascene process or the like. The upper and lower wirings have therebetween a via for electrically coupling these wirings to each other. Thus, the semiconductor substrate SB includes the substrate, the plurality of semiconductor elements, the plurality of interlayer insulating films, and the plurality of wirings.

An electrode pad M1 shown in FIG. 3 is, for example, a conductor film made of Al (aluminum) and is electrically coupled to the semiconductor element on the substrate via the plurality of wirings. The semiconductor substrate SB has thereon a passivation film PV and with this passivation film PV, the upper surface of the semiconductor substrate SB and a portion of the surface of the electrode pad M1 are covered. A portion of the upper surface of the electrode pad M1 is however exposed from an opening portion of the passivation film PV. The passivation film PV is a film (insulating film) for protecting the upper surface of the semiconductor substrate SB, which has finished its wiring step, from external damages and it has a stacked structure having, for example, a silicon oxide film and a silicon nitride film placed thereon.

The passivation film PV has thereon the polyimide layer MP. This polyimide layer MP is an insulating layer thicker than the passivation film PV and has an opening portion on the electrode pad M1. From the bottom portion of the opening portion of the polyimide layer MP, the opening portion of the passivation film PV is exposed so that the electrode pad M1 is exposed from both the passivation film PV and the polyimide layer MP. As a material of the polyimide layer MP, for example, a photosensitive polyimide is used.

The polyimide layer MP, passivation film PV, and the electrode pad M1 each have thereon a first seed film S1, a second seed film S2, a Cu (copper) film C1, a Ni (nickel) film N1, and a Pd (palladium) film P1 in the order of mention from the side of the semiconductor substrate SB. The first seed film S1, the second seed film S2, the Cu film C1, the Ni film N1, and the Pd film P1 configure the redistribution layer W1. The first seed film S1 is made of, for example, Cr (chromium) and the second seed film S2 is made of, for example, Cu (copper). The first seed film S1 and the second seed film S2 configure a seed film SE for forming a Cu film C1 mainly configuring the redistribution layer W1. The Cu film C1, the Ni film N1, and the Pd film P1 are metal films formed successively on the seed film SE by using electroplating.

The seed film SE, the Cu film C1, the Ni film N1, and the Pd film P1 configuring the redistribution layer W1 are stacked films having patterns that overlap with each other and are therefore the same in a plan view and each of these films has no conductor film along their side wall. This means that the whole upper surface of the seed film SE is covered with the Cu film C1, the whole upper surface of the Cu film C1 is covered with the Ni film N1, and the whole upper surface of the Ni film N1 is covered with the Pd film P1, but the sidewall of any of the stacked films configuring the redistribution layer W1 is not covered with the conductor film(s) lying thereon.

For example, the sidewall of the Cu film C1 is exposed from the Ni film N1 and the Pd film P1, the sidewall of the Ni film N1 is exposed from the Pd film P1, and the Pd film P1 covers neither the sidewall of the Ni film N1 nor the sidewall of the Cu film C1. The seed film SE, the Cu film C1, the Ni film N1, and the Pd film P1 have therefore an equal area in a plan view.

The redistribution layer W1 is a wiring pattern that covers a portion of the upper surface of the polyimide layer MP and it covers the opening portion of the polyimide layer MP. The redistribution layer W1 is buried in the opening portion of each of the polyimide layer MP and the passivation film PV and is electrically coupled to the upper surface of the electrode pad M1. To a portion of the upper surface of the redistribution layer W1 is bonded the bonding wire BW. The semiconductor element in the semiconductor substrate SB is therefore electrically coupled to the lead LD (refer to FIG. 1) via the electrode pad M1, the redistribution layer W1, and the bonding wire BW. In order to work the semiconductor device, a predetermined potential is supplied to the semiconductor element and the like from the outside of the IC package (refer to FIG. 1) via the electrode pad M1, the redistribution layer W1, and the bonding wire BW, and an electric signal is input or an electric signal is output externally from the semiconductor element and the like.

Among the stacked films configuring the redistribution layer W1, a main conductive film used mainly for causing an electric current to flow is the Cu film C1. Of the films configuring the redistribution layer W1, the Cu film C1 has therefore the greatest film thickness. The Ni film N1 plays a role of preventing the wiring layers or the semiconductor elements in the semiconductor substrate SB from being destroyed due to impact upon contact bonding during a step of bonding the bonding wire BW to the redistribution layer W1. The Ni film N1 therefore needs a film thickness of at least 1.0 µm in order to fulfill this impact absorbing role. More specifically, the Ni film N1 may be formed with a film thickness of 2.5 nm, 4.5 nm, or the like.

The Pd film P1 is a film formed on the uppermost surface of the redistribution layer W1 and it is a film having a role as an electrode pad (bonding pad) for directly coupling the bonding wire BW to the upper surface of the redistribution layer W1. Since Pd (palladium) is particularly superior to Au (gold) in adhesion with Cu (copper), using not an Au film but a Pd film as an electrode pad enhances the adhesion between the redistribution layer W1 and the bonding wire BW made of Cu (copper). The smaller the thickness of the Pd film P1, the shorter the time spent for a plating step, one of the manufacturing steps, conducted for the formation of the Pd film P1. In addition, a material cost can be reduced as the film thickness is smaller. A manufacturing cost of the semiconductor device can therefore be reduced by setting the film thickness of the Pd film P1 to less than 1.0 µm.

The Pd film P1 is a film formed in order to enhance the coupling strength between the bonding wire BW and the redistribution layer W1 to be used as an electrode pad. The Pd film P1 needs a thickness of 0.2 µm or greater for actualizing this coupling strength stably. This means that in the present embodiment, the Pd film P1 has a thickness of 0.2 µm or greater but less than 1.0 µm, smaller than the film thickness of each of the Cu film C1 and the Ni film N1.

Thus, the Ni film N1 is in contact with the bottom surface of the Pd film P1 configuring the redistribution layer W1 and the Cu film C1 is in contact with the bottom surface of the Ni film N1. With regard to the film thickness of each of these films, the Pd film P1 is thinner than the Ni film N1 and the Ni film N1 is thinner than the Cu film C1. Conductivity is enhanced by increasing the thickness of the Cu film C1; impact resistance against bonding is improved by setting the thickness of the Ni film N1 to 1.0 µm or greater; and a manufacturing cost of the semiconductor device can be reduced by setting the thickness of the Pd film P1 to less than 1.0 µm.

Figure 12:
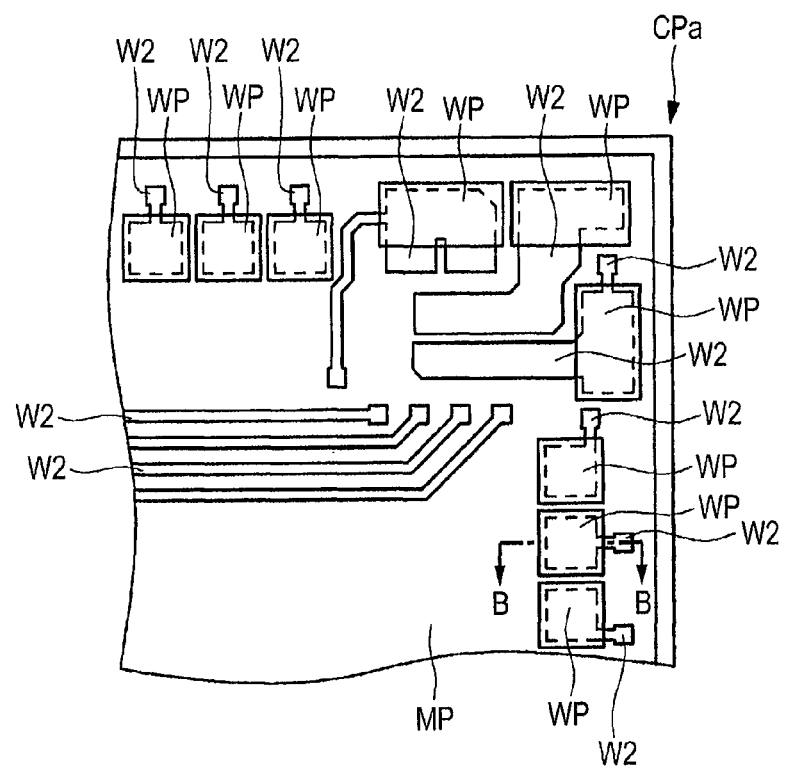
FIG. 12 is a wiring layout showing a method for manufacturing a semiconductor device of a comparative example.
Figure 13:
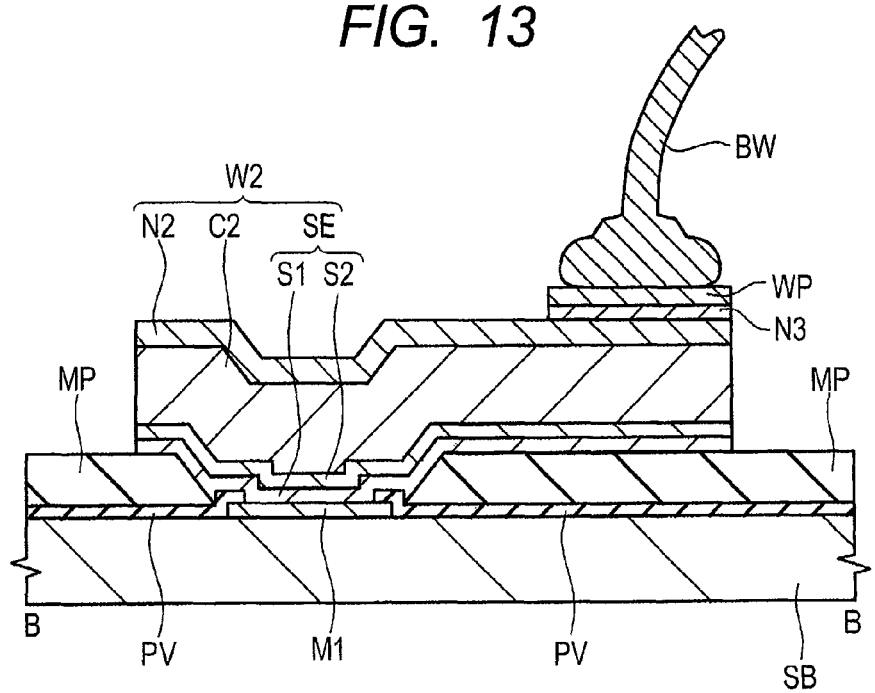
FIG. 13 is a cross-sectional view showing the method for manufacturing a semiconductor device of a comparative example.

In FIG. 12, a wiring layout of a semiconductor device is shown as a comparative example and a cross-sectional view of this semiconductor device is shown in FIG. 13. FIG. 13 is a cross-sectional view taken along a line B-B of FIG. 12. In FIG. 12, a broken line shows the profile of a redistribution layer W2 formed below an electrode pad WP.

As shown in FIG. 12, the wiring layout of a semiconductor chip CPa of the semiconductor device shown as the comparative example is different from that of the present embodiment and it has, over a portion of the redistribution layer W2, the electrode pad WP made of Au (gold). This means that the bonding wire BW (refer to FIG. 13) omitted from FIG. 12 is directly coupled not to the upper surface of the redistribution layer W2 but to the upper surface of the electrode pad (bonding pad) WP. In addition, the redistribution layer W2 has, on the uppermost surfaced thereof, not a Pd film but a Ni film. The reason why the electrode pad WP is formed only over a portion of the redistribution layer W2 is because Au (gold) configuring the electrode pad WP is expensive and adhesion between Au (gold) and a molding resin (not illustrated) that covers the semiconductor chip CPa is poor.

In the semiconductor chip CPa of the comparative example shown in FIG. 12, the electrode pad WP is formed with an area as small as possible. The electrode pad WP therefore covers only a portion of the upper surface of the redistribution layer W2 and in another area, the upper surface of the redistribution layer W2 is exposed from the electrode pad WP. When a conductor film made of Au (gold) is thus used as the electrode pad over the redistribution layer W2, a formation area of the electrode pad WP is minimized in order to prevent deterioration in adhesion with a molding resin and an increase in the manufacturing cost. In short, the area of the electrode pad WP is the minimum area necessary for coupling the bonding wire thereto.

As shown in FIG. 13, the redistribution layer W2 of the semiconductor device of the comparative example is a stacked film having a seed film SE, a Cu film C2, and a Ni film N2 formed successively in the order of mention on a polyimide layer MP. The respective structures of the semiconductor substrate SB, the electrode pad M1, the passivation film PV, the polyimide layer MP, and the seed film SE are similar to those of the present embodiment shown in FIG. 3. The Cu film C2 and the Ni film N2 are conductive films formed on the seed film SE by using plating and the redistribution layer W2 has a pattern shape as shown in FIG. 12.

As shown in FIG. 13, the redistribution layer W2 has, in a portion over the upper surface thereof, the electrode pad WP made of an Au film. The electrode pad WP and the redistribution layer W2 have therebetween a Ni film N3 formed as an extra underlying layer of the electrode pad WP. The Ni film N3 has the same pattern shape as the electrode pad WP in a plan view. The Ni film N3 and the electrode pad WP are conductive films formed on the Ni film N2 by using plating. The electrode pad WP has, on the upper surface thereof, the bonding wire BW made of Cu (copper) and this bonding wire is contact bonded to the upper surface of the electrode pad WP and is electrically coupled to the electrode pad WP. The bonding wire made of Cu (copper) may hereinafter be called "Cu wire" and that made of Au (gold) may hereinafter be called "Au wire".

Au (gold) may be employed as a material of the bonding wire BW, but with a view to decreasing a material cost, Cu (copper) may be used as the material. When as in the semiconductor device of the comparative example, the bonding wire BW made of Cu (copper) is bonded to the upper surface of the electrode pad WP made of Au (gold), poor adhesion between Au (gold) and Cu (copper) deteriorates bond strength between the electrode pad WP and the bonding wire BW. As a result, the semiconductor device thus obtained may have deteriorated reliability. This is the problem that occurs due to poor adhesion between the Au film and the Cu wire compared with the case where an Au wire is bonded to an Au film or a Cu wire is bonded to a Pd film.

In the semiconductor device of the comparative example, the pattern of the redistribution layer W2 cannot be used as that of the electrode pad and it is necessary to form the electrode pad WP with a pattern different from that of the redistribution layer W2. Compared with the case where a bonding wire is directly bonded to a redistribution layer, there occur problems such as deterioration in the freedom degree of the layout of the redistribution layer and an increase in an area of the semiconductor device. Thus, when the freedom degree of the wiring layout decreases or when the area of the electrode pad WP made of Au (gold) is minimized, a sufficient contact area between the bonding wire BW and the electrode pad WP cannot be secured and there is a possibility of decrease in the coupling strength between the bonding wire BW and the electrode pad WP.

On the other hand, the semiconductor device of the present embodiment has, on the upper surface thereof, the redistribution layer W1 permitting wire bonding thereto as shown in FIGS. 2 and 3 so that it is not necessary to form an electrode pad in addition to the redistribution layer W1. Since the redistribution layer W1 has, on the upper surface thereof, the Pd film P1 superior to an Au film in coupling property to a Cu wire, the bond strength of the bonding wire WB can be made greater than that of the semiconductor device of the comparative example shown in FIGS. 12 and 13. The semiconductor device thus obtained has therefore improved reliability.

In the semiconductor device shown in FIGS. 12 and 13, the redistribution layer W2 has thereon the electrode pad WP for bonding. In the present embodiment, on the other hand, it is not necessary to form an electrode pad on the redistribution layer W1 shown in FIG. 2 and FIG. 3 and the bonding wire BW can be bonded directly to the upper surface of the redistribution layer W1, which improves the freedom degree of the wiring layout of the redistribution layer W1. This actualizes miniaturization of a semiconductor device.

Compared with the case where the bonding wire is bonded to the electrode pad WP of FIG. 12 formed with a pattern of a minimum area, it is possible, in the semiconductor device of the present embodiment shown in FIG. 2, to bond the bonding wire in any region on the upper surface of the redistribution layer W1 and to secure a wider area for bonding because of improvement in the freedom degree of the wiring layout. Accordingly, an area of a bonding region between the bonding wire BW (refer to FIG. 3) and the upper surface of the redistribution layer W1 can be increased and therefore, bond strength of the bonding wire BW can be improved. As a result, the semiconductor device thus obtained has improved reliability.

Moreover, even if a bonding apparatus with low accuracy is used and misalignment occurs at the bonding position, the bonding wire BW can be bonded to any region on the upper surface of the redistribution layer W1 so that a coupling failure due to misalignment of bonding can be prevented and a semiconductor device with improved reliability can be provided.

In addition, neither the Ni film N3 (refer to FIG. 13) different in pattern from the redistribution layer W1 nor the electrode pad WP (refer to FIG. 13) composed of Au (gold) more expensive than Pd (palladium) or the like is necessary on the Ni film N1 shown in FIG. 3. Such a structure makes it possible to prevent the structure of the semiconductor device from becoming complex and to reduce the cost of the semiconductor device.

When a bonding wire BW made of Au (gold) is used in the above-mentioned comparative example and the present embodiment, no problem occurs due to poor adhesion between the Au film used as an electrode pad and the Cu wire. As described above, however, the present embodiment does not need the electrode pad in addition to the redistribution layer, which improves the freedom degree of the wiring layout and thereby brings effects for reducing the cost of a semiconductor device and actualizing a smaller semiconductor device. In addition, a wider area can be secured for bonding and therefore, the bonding wire BW can be bonded with improved bond strength. As a result, the semiconductor device thus obtained has improved reliability.

Next, a method for manufacturing the above-mentioned semiconductor device of the present embodiment will be described referring to FIGS. 4 to 11. FIGS. 4 to 11 are cross-sectional views showing the method for manufacturing the semiconductor device of the present embodiment. The present embodiment relates to a technology of an interlayer insulating film adjacent to a metal wiring so that a detailed description on the formation of semiconductor elements and wiring layers on the substrate is omitted.

Figure 4:
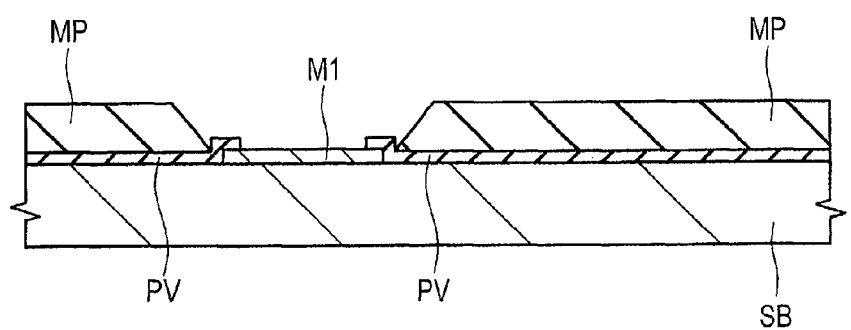
FIG. 4 is a cross-sectional view showing a method for manufacturing the semiconductor device according to the one embodiment of the invention.

First, a plurality of semiconductor elements is formed on a substrate made of, for example, single crystal Si (silicon) as shown in FIG. 4 by using a typical semiconductor manufacturing technology. The semiconductor element is, for example, an MISFET or capacitor. Then, an interlayer insulating film covering the plurality of semiconductor elements and a contact plug penetrating through the interlayer insulating film and electrically coupled to the semiconductor elements are formed. Then, on the interlayer insulating film, a plurality of interlayer insulating films and a plurality of wirings buried in these interlayer insulating films, respectively, are formed. These wirings are electrically coupled to the plurality of semiconductor elements and utilized as a lead wiring for inputting/outputting an electric signal to the semiconductor elements. In such a manner, a semiconductor substrate SB including the substrate, the plurality of semiconductor elements, the plurality of interlayer insulating films, and the plurality of wirings is formed.

Next, an electrode pad M1 electrically coupled to the plurality of wirings is formed on the upper surface of the semiconductor substrate SB. The electrode pad M1 is formed, for example, by patterning an Al (aluminum) film, which has been formed on the upper surface of the semiconductor substrate SB by using sputtering or the like, by using photolithography and etching.

A passivation film PV serving as a surface protecting film is then formed on the semiconductor substrate SB to cover the electrode pad M1. The passivation film PV is made of, for example, a silicon oxide film and a silicon nitride film stacked thereon and it can be formed, for example, by CVD. An opening portion is then formed in the passivation film PV by using photolithography and etching to expose the upper surface of the electrode pad M1 from the bottom of this opening portion.

Next, a polyimide layer MP is formed on the passivation film PV from which the electrode pad M1 is exposed. This polyimide layer MP is patterned to expose the electrode pad M1. In such a manner, the structure as shown in FIG. 4 is obtained.

Figure 5:
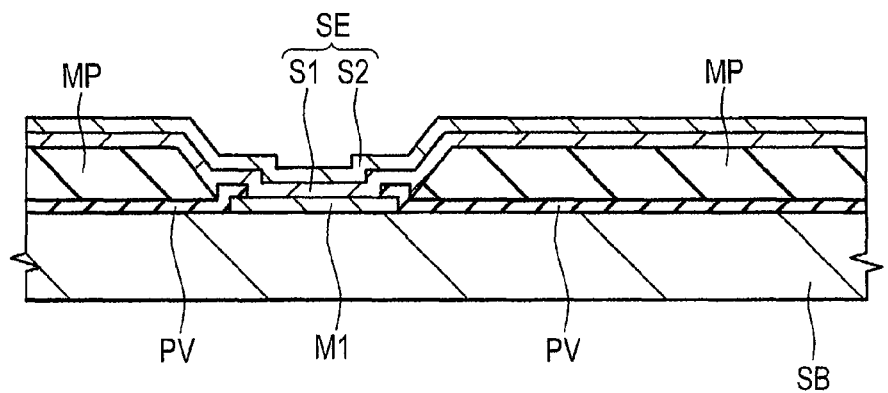
FIG. 5 is a cross-sectional view showing the method for manufacturing the semiconductor device following that of FIG. 4.

Next, as shown in FIG. 5, a first seed film S1 and a second seed film S2 are formed successively on the electrode pad M1, the passivation film PV, and the polyimide layer MP by using sputtering. The first seed film S1 is a conductive film made of Cr (chromium) and the second seed film S2 is a conductive film made of Cu (copper). The first seed film S1 and the second seed film S2 configure a seed film SE. The seed film SE is a film to be used as a conductive film when a Cu film C1 will be formed later by electroplating.

Figure 6:
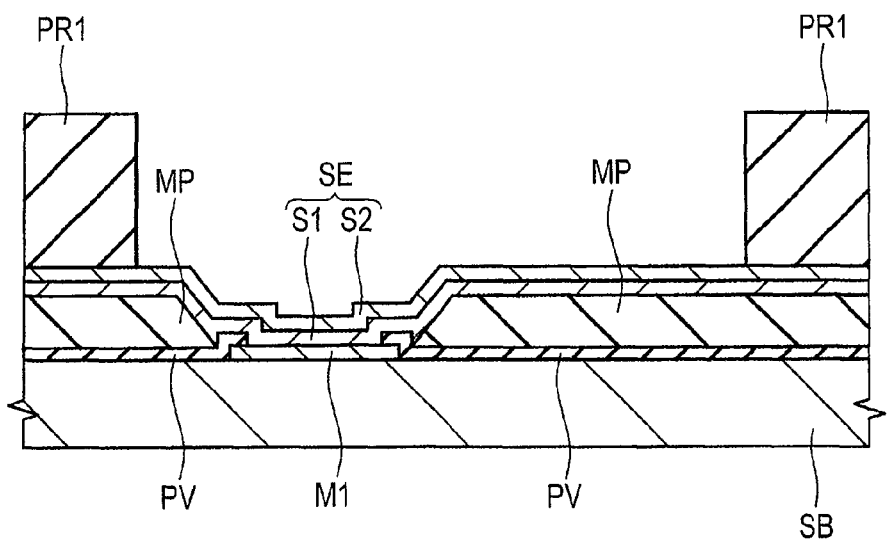
FIG. 6 is a cross-sectional view showing the method for manufacturing the semiconductor device following that of FIG. 5.

Next, as shown in FIG. 6, a photoresist film PR1 which has been patterned to have a plurality of opening portions is formed on the seed film SE. The photoresist film PR1 is formed so as not to cover the area immediately above the opening portion of the passivation film PV. This means that the electrode pad M1 in a region exposed from the opening portion of the passivation film PV is exposed from the bottom of the opening portion of the photoresist film PR1.

Next, as shown in FIG. 7, a Cu film C1 and a Ni film N1 are formed on the seed film SE by using plating. The Cu film C1 is formed by using electroplating with the seed film SE as a conductive film. The Ni film N1 is formed by using electroplating with the Cu film C1 as a conductive film. The Ni film N1 relaxes impact in the contact bonding step of a bonding wire which will be conducted later and preventing the destruction of the wirings or semiconductor elements configuring the semiconductor substrate SB, thus serving as an impact absorbing film. The thickness of the Ni film N1 necessary for absorbing the impact due to contact bonding of the bonding wire is 1.0 µm or greater. The Cu film C1 is used as a conductive film in the redistribution layer including the seed film SE, the Cu film C1, and the Ni film N1 so that it is formed with a film thickness greater than that of the seed film SE and that of the Ni film N1.

The film stack of the Cu film C1 and the Ni film N1 is formed with a height lower than that of the photoresist film PR1. Accordingly, the film stack of the Cu film C1 and the Ni film N1 is formed on the seed film SE exposed from the plurality of opening portions of the photoresist film PR1. This means that although the Cu film C1 is formed with the seed film SE covering the whole surface on the semiconductor substrate SB as a conductive film, a portion of the upper surface of the seed film SE is covered with the photoresist film PR1 so that the film stack of the Cu film C1 and the Ni film N1 is formed immediately above the seed film SE exposed from the photoresist film PR1. The film stack of the Cu film C1 and the Ni film N1 is therefore formed immediately above the electrode pad M1 in a region exposed from the opening portion of the passivation film PV.

The Cu film C1 and the Ni film N1 are formed successively by using electroplating. This prevents formation of an oxide film or the like on the upper surface of the Cu film C1.

Next, as shown in FIG. 8, a Pd film P1 is formed on the Ni film N1 by using electroplating. The Pd film P1 is a conductive film formed subsequent to the step of forming the Ni film N1 and it is formed by using electroplating with the Ni film N1 as a conductive film. In the present embodiment, after the step of forming the photoresist film PR1 described above referring to FIG. 6, the Cu film C1, the Ni film N1, and the Pd film P1 are formed in successive steps. This means that none of a washing step, a heating step, a step of forming another conductor film, an insulating film, a photoresist film, or the like, and a step of removing another film is inserted between the formation step of the Cu film C1 and the formation step of the Ni film N1 and between the formation step of the Ni film N1 and the formation step of the Pd film P1.

The Pd film P1 is a film formed so as to enhance the coupling strength with the bonding wire BW and film thickness of 0.2 µm or greater is necessary in order to stably achieve the coupling strength. When the Pd film P1 is thinner, however, time spent for the plating step for forming the Pd film P1 can be reduced and moreover, it reduces a material cost. Controlling the thickness of the Pd film P1 to less than 1.0 µm improves the throughput of the manufacturing steps of the semiconductor device and reduces an amount of Pd (palladium) to be used for the film formation, thereby reducing a manufacturing cost of the semiconductor device. In the present embodiment, therefore, the thickness of the Pd film P1 is 0.2 µm or greater but less than 1.0 µm and is smaller than the thickness of each of the Cu film C1 and the Ni film N1.

The Pd film P1 is formed with an upper surface height lower than that of the photoresist film. This means that the film stack composed of the Cu film C1, the Ni film N1, and the Pd film P1 is formed in a region not having therein the photoresist film R1, that is, a region on the seed film SE in the opening portion of the photoresist film PR1. In a plan view, the Cu film C1, the Ni film N1, and the Pd film P1 have a pattern of the same shape so that the whole upper surface of the Cu film C1 is covered with the Ni film N1 and the whole upper surface of the Ni film N1 is covered with the Pd film P1. The sidewall of the Cu film C1 is in contact with the photoresist film PR1; the Cu film C1 has, on the sidewall thereof, neither the Ni film N1 nor the Pd film P1; and the Ni film N1 does not have, on the sidewall thereof, the Pd film P1.

Figure 9:
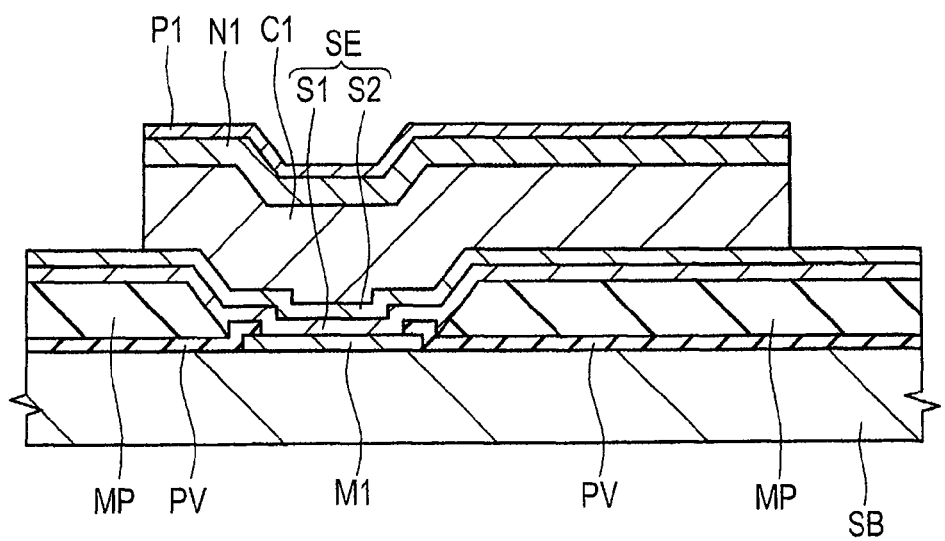
FIG. 9 is a cross-sectional view showing the method for manufacturing the semiconductor device following that of FIG. 8.

Next, as shown in FIG. 9, the photoresist film PR1 is removed by using asking treatment. By this treatment, the upper surface of the seed film SE in a region covered with the photoresist film PR1, the sidewall of the Cu film C1, the sidewall of the Ni film N1, and the sidewall of the Pd film P1 are exposed.

Figure 10:
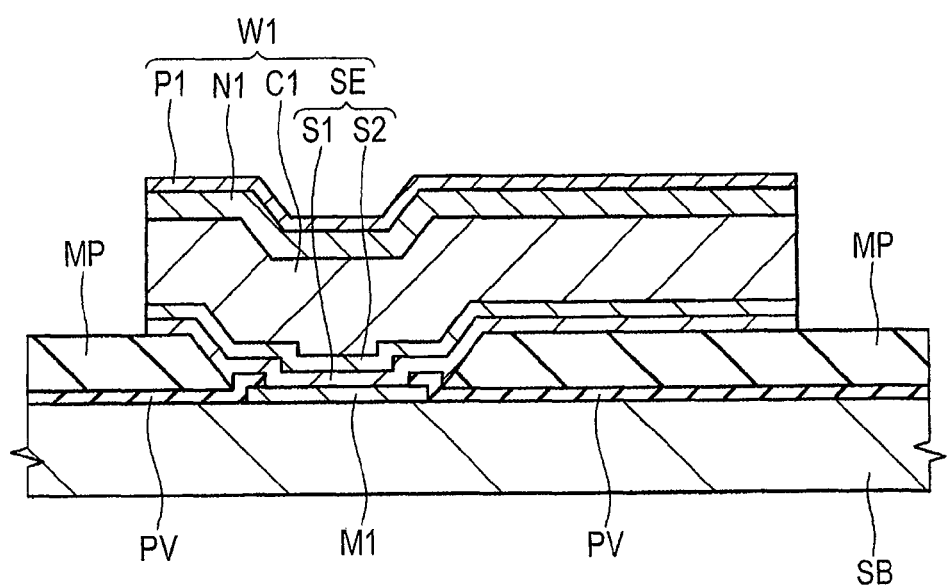
FIG. 10 is a cross-sectional view showing the method for manufacturing the semiconductor device following that of FIG. 9.

Next, as shown in FIG. 10, an etching step is conducted to remove the seed film SE exposed from the Cu film C1 and expose the upper surface of the polyimide layer MP. At this time, the seed film SE in a region covered with the Cu film C1, that is, the seed film SE immediately below the Cu film C1 remains without being removed. In a plan view, the seed film SE therefore has the same pattern shape as that of the film stack of the Cu film C1, the Ni film N1, and the Pd film P1. By removing a portion of the seed film SE and separating the seed film SE on the semiconductor substrate SB into a plurality of the seed films SE, a plurality of redistribution layers W1 composed of the seed film SE, the Cu film C1, the Ni film N1, and the Pd film P1 is formed on the semiconductor substrate SB.

At this time, the sidewall of the Cu film C1 is exposed from the Ni film N1 and the Pd film P1; the sidewall of the Ni film N1 is exposed from the Pd film P1; and the Pd film P1 covers neither the sidewall of the Ni film N1 nor the sidewall of the Cu film C1. This means that the sidewall of each of the conductive films configuring the redistribution layer W1 is exposed from the other conductive film. At this time, the wiring layout of the redistribution layer W1 in a plan view has, for example, a structure as shown in FIG. 2.

Next, although not shown in the drawing, the lower surface of the semiconductor substrate SB is ground using a back grinding method to thin the semiconductor substrate SB. Then, with a dicing blade, the semiconductor substrate SB is diced into individual semiconductor chips (dies). Then, these semiconductor chips are mounted on the upper surfaces of die pads, respectively, and die bonded with an Ag (silver) paste as an adhesive.

Figure 11:
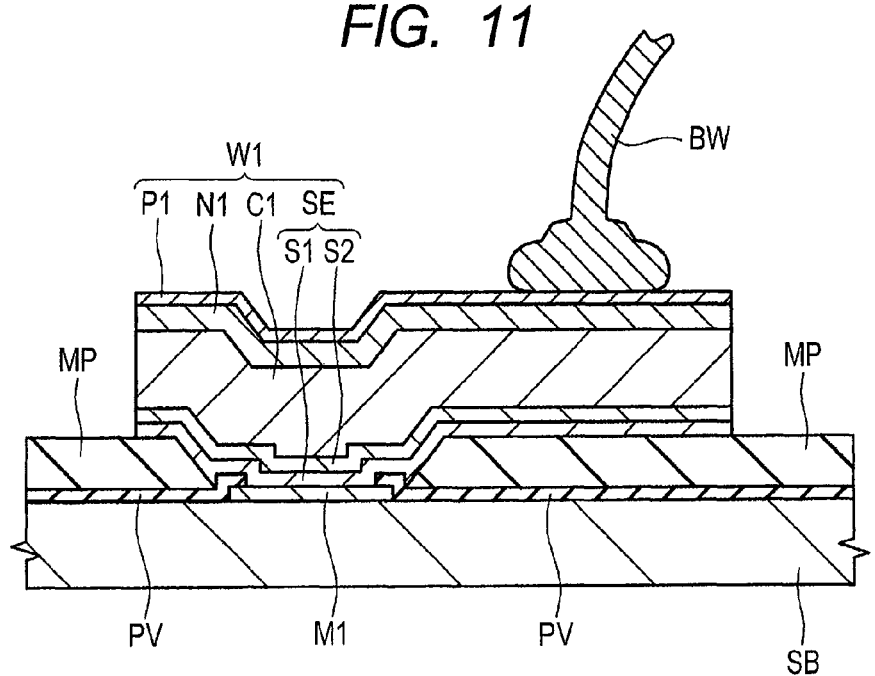
FIG. 11 is a cross-sectional view showing the method for manufacturing the semiconductor device following that of FIG. 10.

Next, as shown in FIG. 11, with a bonding wire BW made of Cu (copper), the redistribution layer W1 on the upper surface of the semiconductor chip is electrically coupled to each of a plurality of leads (not illustrated) placed around the die pad (not illustrated). The tip of the bonding wire BW is processed into, for example, a ball-like shape before bonding to the upper surface of the redistribution layer W1 and it is bonded through a capillary. Then, the capillary is transferred to the side of the lead and the edge portion of the bonding wire BW is bonded to the upper surface of the lead. Then, the tip of the bonding wire BW is melted to form a ball by the discharge of an electric torch. By repeating this step, the plurality of the redistribution layers W1 is bonded to the plurality of the leads.

In the bonding step, when contact bonding is conducted by pressing the tip of the bonding wire BW against the upper surface of the redistribution layer W1, a pressure may be applied to the semiconductor substrate SB via the redistribution layer W1. Since the Ni film N1 is formed with a thickness of 1.0 μm or greater so as to relax the pressure (impact), it is possible to prevent the semiconductor substrate SB from being subjected to impact of the bonding step and prevent the wirings and semiconductor elements in the semiconductor substrate SB from being destroyed.

Next, as shown in FIG. 1, the die pad DP, the semiconductor chip CP, the bonding wire BW, and a portion of the lead LD are sealed with a mold MO. After cutting a tie bar that couples the leads with each other, the leads are deformed by pressing or the like if necessary to complete the semiconductor device of the present embodiment.

The effect of the method for manufacturing the semiconductor device according to the present embodiment will next be described.

When the electrode pad WP is provided on the redistribution layer W2 as in the semiconductor device of the comparative example described referring to FIGS. 12 and 13, the manufacturing steps of it are similar to those of the present embodiment until the step described referring to FIG. 6. This means that steps similar to those of the present embodiment are conducted until the step of forming the photoresist film PR1 shown in FIG. 6.

Figure 14:
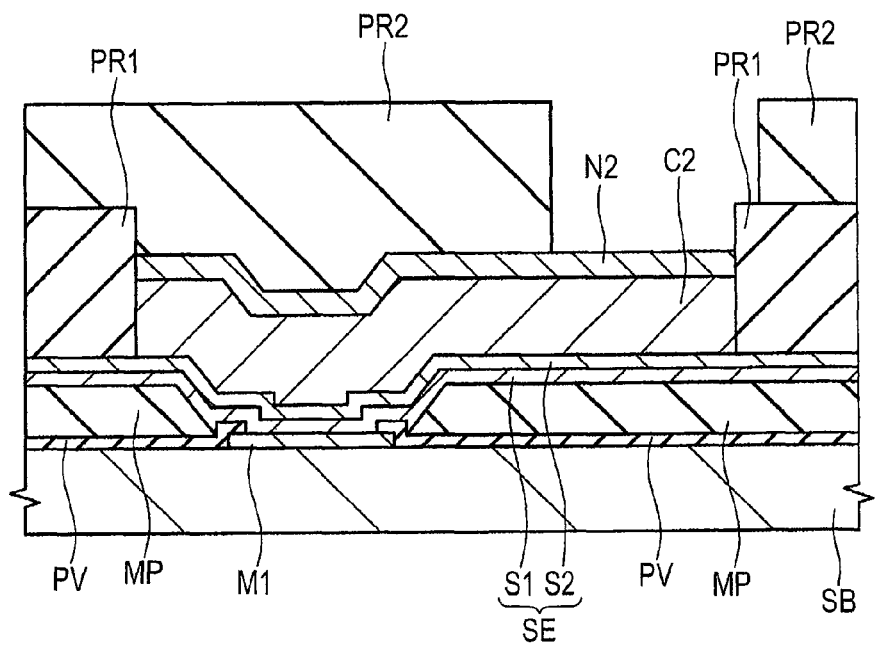
FIG. 14 is a cross-sectional view showing the method for manufacturing a semiconductor device of a comparative example.

In the manufacturing steps of the above-mentioned semiconductor device of the comparative example, after the step described referring to FIG. 6, a Cu film C2 and an Ni film N2 are formed on the seed film SE exposed in the opening portion of the photoresist film PR1 by using electroplating as shown in FIG. 14 in a similar step to that described referring to FIG. 7.

Next, a photoresist film PR2 is formed on the photoresist film PR1 and the Ni film N2. The photoresist film PR2 is formed so as to cover a portion of the upper surface of the Ni film N2 and expose the other portion of the upper surface of the Ni film N2. FIG. 14 is a cross-sectional view of the semiconductor device of the comparative example during its manufacturing step. Here, a region on the Ni film N2 exposed from the opening portion of the photoresist film PR2 is a formation region of an electrode pad for coupling a bonding thereto in the later step.

Figure 15:
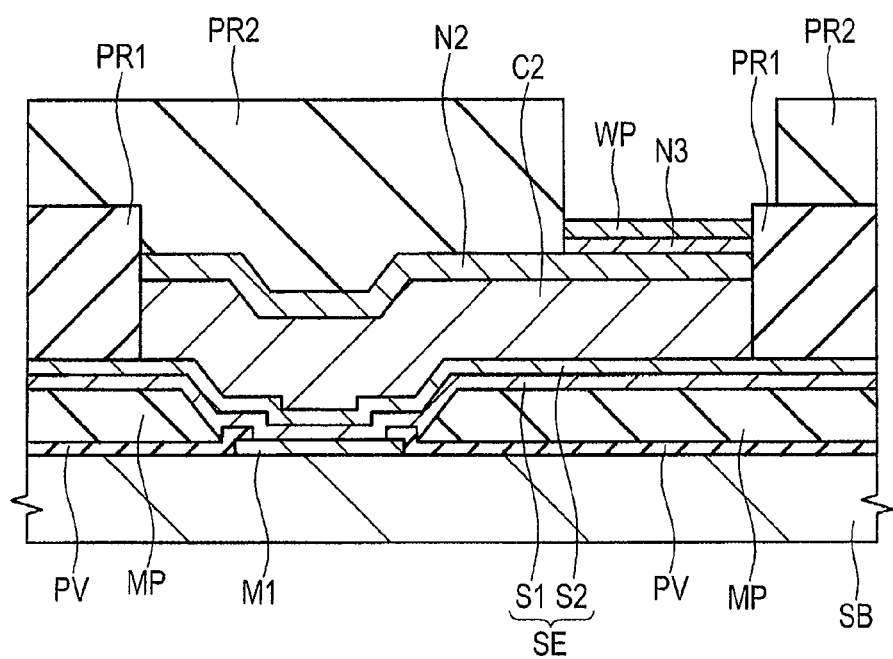
FIG. 15 is a cross-sectional view showing the manufacturing method following that of FIG. 14.

Next, as shown in FIG. 15, a Ni film N3 and an electrode pad WP are formed on the Ni film N2 successively by electroplating. FIG. 15 is a cross-sectional view of the semiconductor device of the comparative example during its manufacturing step. The Ni film N3 is formed using electroplating with the Ni film N2 as a conductive film and the electrode pad WP is formed using electroplating with the Ni film N3 as a conductive film. The Ni film N3 is an extra underlying layer of the electrode pad. The electrode pad WP is made of Au (gold) film and it is formed with an upper surface height not exceeding the upper surface height of the photoresist film PR2. The electrode pad WP is therefore formed so as to cover the whole upper surface of the Ni film N3 and a portion of the upper surface of the Ni film N2. This means that neither the Ni film N3 nor the electrode pad WP is formed in a region immediately above the Ni film N2 and covered with the photoresist film PR2.

Next, after removal of the photoresist films PR1 and PR2, the seed film SE is removed as in the step described referring to FIG. 10 to form a redistribution layer W2 comprised of the seed film SE, the Cu film C2, and the Ni film N2. Then, a bonding wire BW is bonded to the upper surface of the electrode pad WP to electrically couple the semiconductor chip CPa (refer to FIG. 12) and a plurality of leads (not illustrated) via a bonding wire BW and obtain the structure shown in FIG. 13.

In the semiconductor device of the comparative example manufactured as described above, the electrode pad WP made of Au (gold) is formed in a region on a portion of the redistribution layer W2 and wire bonding to the upper surface of the electrode pad WP is conducted as shown in from FIGS. 12 and 15. The reason why the electrode pad WP is formed only on a portion of the redistribution layer W1 is that as described above, Au (gold) configuring the electrode pad WP is expensive and in addition, Au (gold) exhibits only poor adhesion with a molding resin (not illustrated) covering the semiconductor chip CPa therewith.

When the steps described referring to FIGS. 14 and 15 are conducted, the pattern of the photoresist film PR2 should be formed using a mask (reticle) different from a mask (reticle) for forming the photoresist film PR1 in order to form the electrode pad WP having a pattern different from that of the redistribution layer W2. In addition, the semiconductor device of the comparative example uses Au (gold), which is a more expensive material than Pd (palladium), for the electrode pad WP and moreover, it has the Ni film N3 which is an extra underlying layer for improving the coupling property between the electrode pad WP and the redistribution layer W2. These factors may increase a manufacturing cost of the semiconductor device of the comparative example.

In the semiconductor device of the present embodiment, on the other hand, the Pd film P1 to be used as an electrode pad is formed on the upper surface of the redistribution layer W1 with the same pattern as that of the films configuring the redistribution layer W1 including the Cu film C1. In the step described referring to FIG. 8, therefore, the Pd film P1 which is an electrode pad is formed without forming a photoresist film in addition to the photoresist film PR1 used for the formation of the Cu film C1 and the Ni film N1.

Thus, because the manufacturing step of the semiconductor device of the comparative example that needs, for the formation of the photoresist film PR2, provision of a mask (reticle) for the formation of the electrode pad WP (refer to FIG. 15) is not necessary in the method for manufacturing the semiconductor device of the invention, the semiconductor device can be manufactured with fewer steps. In addition, in the present embodiment, it is not necessary to form an electrode pad by using expensive Au (gold) and also it is not necessary to form another Ni film as an extra underlying layer on the Ni film N1. This makes it possible to reduce the manufacturing cost of the semiconductor device by improve the throughput.

As described referring to FIGS. 13 and 15, when the photoresist films PR1 and PR2 are removed after formation of the electrode pad WP, contaminants due to the removing step of the photoresist film PR2 attach to the upper surface of the electrode pad WP. They may deteriorate the coupling strength between the electrode pad WP and the bonding wire BW when the bonding wire BW is bonded to the upper surface of the electrode pad WP after the removing step.

In the present embodiment, only the photoresist film PR1 is removed after formation of the Pd film P1 to be used as the electrode pad and a removing amount of the photoresist film is less than that in the comparative example so that an amount of contaminants attached to the upper surface of the Pd film P1 can be reduced. This makes it possible to keep the surface of the Pd film P1 under better conditions and improve the coupling strength between the Pd film P1 and the bonding wire BW. As a result, the semiconductor device thus obtained has improved reliability.

Moreover, in the comparative example, since the formation of the Ni film N2 (refer to FIG. 14) is followed by an application step for the formation of the photoresist film PR2, an exposure step, transfer of a mask, and formation of the Ni film N3 (refer to FIG. 15), there is a possibility of peeling of a deposit film due to poor adhesion between the Ni film N2 and the Ni film N3. In the present embodiment, as shown in FIGS. 7 and 8, the Cu film C1, the Ni film N1, and the Pd film P1 are formed successively without inserting the step of forming or removing a photoresist film or the like so that a coupling property (adhesion) between the deposit films can be improved.

In addition, as described above, relatively poor adhesion between the Au (gold) film (electrode pad WP) and the Cu wire (bonding wire BW) deteriorates the bond strength between the electrode pad WP and the bonding wire BW, leading to a problem that the semiconductor device thus obtained has deteriorated reliability.

In the semiconductor device of the comparative example, the electrode pad WP should be provided with a pattern different from that of the redistribution layer W2. It reduces the freedom degree of the layout of the redistribution layer, leading to such a problem as an increase in the area of the semiconductor device.

In order to reduce a region where the electrode pad WP and the molding resin are brought into contact with each other, reduce the using amount of Au (gold), and thereby reduce a manufacturing cost, it may be possible to minimize the area of the electrode pad WP. In this case, however, a sufficient contact area between the bonding wire BW and the electrode pad WP cannot be secured so that there is a possibility of a decrease in the coupling strength between the bonding wire BW and the electrode pad WP.

On the other hand, in the present embodiment, as shown in FIG. 11, the Pd (palladium) film P1 superior to an Au (gold) film in adhesion with a Cu wire is formed on the upper surface of the redistribution layer W1 and the bonding wire BW is coupled directly to the upper surface of the redistribution layer W1. This improves the coupling strength between the bonding wire BW and the semiconductor chip CP (refer to FIG. 2). As a result, the semiconductor device thus obtained has improved reliability.

In addition, in the present embodiment, the electrode pad WP for bonding is formed on the redistribution layer W2. In the present embodiment, the bonding wire BW can be directly bonded to the upper surface of the redistribution layer W1 without forming the electrode pad WP. This makes it possible to improve the freedom degree of the wiring layout of the redistribution layer W1 and decrease the area of the semiconductor device.

In addition, a wide area is secured for bonding by enabling bonding to the upper surface of the redistribution layer W1 and improving the freedom degree of the wiring layout so that improved bond strength of the bonding wire BW can be achieved. As a result, the semiconductor device thus obtained has improved reliability.

Moreover, even if a bonding apparatus with low accuracy is used and misalignment therefore occurs at a bonding position, bonding can be conducted in any region of the upper surface of the redistribution layer W1 so that coupling failure due to the misalignment of bonding can be prevented. As a result, the semiconductor device thus obtained has improved reliability.

The invention made by the present inventors has so far been described based on the embodiment. It is needless to say that the invention is not limited to or by the embodiment and can be changed in various ways without departing from the gist of the invention.

What is claimed is:

1. A semiconductor device comprising:
    a semiconductor substrate;
    a first wire over the semiconductor substrate;
    an insulating film formed over the semiconductor substrate and the first wire, and having an opening so as to expose an upper surface part of the first wire;
    a second wire formed over the insulating film so as to be connected with the first wire in the opening; and
    a bonding wire connected with the second wire, wherein the second wire is a stack of a Cu film, a Ni film and a Pd film in order from the first wire, wherein the bonding wire is directly connected with the Pd film and a connection part of the bonding wire and the Pd film is outside of the opening in a plan view and overlaps the insulating film, wherein the Pd film has a film thickness smaller than that of the Ni film, and wherein the bonding wire includes Cu.

2. The semiconductor device according to claim 1, wherein the semiconductor substrate includes a substrate, a plurality of semiconductor elements, a plurality of interlayer insulating films, and a plurality of wirings.

3. The semiconductor device according to claim 1, wherein the connection part is located outside from the first wiring.

4. The semiconductor device according to claim 1, wherein the insulating film including polyimide layer and the connection part is located over the polyimide layer.

5. The semiconductor device according to claim 1, wherein the Cu film, the Ni film and the Pd film have the same pattern shape in the plan view.

6. The semiconductor device according to claim 1, wherein the Ni film has a film thickness smaller than that of the Cu film.

7. The semiconductor device according to claim 1, wherein the semiconductor device is sealed with a resin.

8. A manufacturing method a semiconductor device, comprising:

(a) providing a semiconductor substrate having an electrode pad;
(b) forming an insulating film over the electrode pad;
(c) forming an first opening in the insulating film so as to expose an upper surface part of the electrode pad;
(d) forming a seed film over the insulating film and in contact with the upper surface of the electrode pad;
(e) forming a resist pattern having a second opening exposing the upper surface of the electrode pad and an upper surface of the insulating film over the seed film;
(f) forming a Cu film, an Ni film, and a Pd film successively over the seed film exposed from the resist pattern by using plating;
(g) after the step (f), removing the resist pattern; and
(h) directly coupling a bonding wire to an upper surface of the Pd film, wherein the bonding wire is directly connected with the Pd film and a connection part of the bonding wire and the Pd film is outside of the first opening in a plan view and overlaps the insulating film, wherein the Pd film has a film thickness smaller than that of the Ni film, and wherein the bonding wire includes Cu.

9. The manufacturing method according to claim 8, wherein the Cu film, the Ni film, and the Pd film have the same pattern shape in the plan view.

10. The manufacturing method according to claim 8, wherein the Ni film has a film thickness smaller than that of the Cu film.

* * * * *